United States Patent [19]

De Bruin

[11] Patent Number: 5,240,879
[45] Date of Patent: Aug. 31, 1993

[54] METHOD OF MANUFACTURING A SEMICONDUCTOR DEVICE HAVING CONDUCTIVE MATERIAL PROVIDED IN AN INSULATING LAYER

[75] Inventor: Leendert De Bruin, Eindhoven, Netherlands

[73] Assignee: U.S. Philips Corp., New York, N.Y.

[21] Appl. No.: 848,806

[22] Filed: Mar. 10, 1992

[30] Foreign Application Priority Data

Mar. 20, 1991 [GB] United Kingdom ............... 9105943

[51] Int. Cl.$^5$ .......................................... H01L 21/441
[52] U.S. Cl. .................................. 437/190; 437/192; 437/195; 437/230
[58] Field of Search ............... 437/230, 190, 192, 189, 437/195; 427/98, 304, 305; 257/751, 753, 764

[56] References Cited

U.S. PATENT DOCUMENTS 4,822,753  4/1989  Pintchovski et al. .
5,055,423  10/1991 Smith et al. .................. 437/187

FOREIGN PATENT DOCUMENTS 0223920  6/1987  European Pat. Off. .
0359109  3/1990  European Pat. Off. .......... 437/192
2-185205  7/1990  Japan .
2143372  2/1985  United Kingdom ............ 437/190

OTHER PUBLICATIONS

Ting, C. H., et al., "Selective Electroless Metal Deposition ..." *J. Electrochem. Soc.* vol. 136, No. 2, Feb. 1989, pp. 456–462.

European Search Report of EP 92 20 0697.

*Primary Examiner*—T. N. Quach
*Attorney, Agent, or Firm*—Steven R. Biren

[57] ABSTRACT

A semiconductor body has a surface structure (10) with an insulating layer (11) through which is formed an opening (12) defining a side wall (13) of insulating material bounding an exposed surface area (14a) of a region (14). An activating layer (15) is provided on the exposed surface area (14a) and the side wall (13) of the opening (12), and electrically conductive material deposited on the activating layer (15) to form an electrically conductive region (16) in the opening (12). The activating layer is provided so that the material (15a) on the sidewall (13) has different composition from the material (15b) on the exposed surface area (14a) and is selectively etched to remove the material (15a) from the sidewall (13) of the opening (12) leaving only the activating layer portion (15b) on the surface area (14a) of the underlying region so that little or no deposition of the electrically conductive material occurs on the opening sidewall (13), thereby inhibiting sideways growth of the electrically conductive material and thus avoiding or at least reducing the possibility of voids being formed in the electrically conductive region.

9 Claims, 2 Drawing Sheets

METHOD OF MANUFACTURING A SEMICONDUCTOR DEVICE HAVING CONDUCTIVE MATERIAL PROVIDED IN AN INSULATING LAYER

BACKGROUND OF THE INVENTION

This invention relates to a method of manufacturing a semiconductor device, which method comprises providing a semiconductor body having at a major surface a surface structure comprising an insulating layer through which is formed an opening defining a sidewall of insulating material bounding an exposed surface area of a region beneath the insulating layer, providing an activating layer on the exposed surface area and the sidewall of the opening, and depositing electrically conductive material to form an electrically conductive region in the opening in electrical contact with the underlying region.

U.S. Pat. No. 4,822,753 describes such a method. In the in U.S. Pat. No. 4,822,753, the opening in the insulating layer exposes a silicide surface area of a silicon device region and the activating layer is provided by blanket depositing a layer of titanium nitride over the insulating layer. A levelling or planarizing agent such as a spin-on-glass is then applied over the surface to fill the opening. The levelling agent is then etched anisotropically to leave the levelling agent only in the opening. The activating or nucleating layer is then etched using the levelling agent as a mask so as to remove the exposed areas of the activating layer. After removal of the remaining levelling agent, the titanium nitride activating layer provides a nucleation surface for the selective deposition of tungsten to form the electrically conductive material region or plug in electrical contact with the underlying region exposed by the opening.

In the method described in U.S. Pat. No. 4,822,753, the levelling agent acts as an etch mask to enable the portion of the activating layer in the surface of the insulating layer to be removed. However, the sidewall of the opening remains covered by the activating layer after removal of the remaining levelling agent. Accordingly, nucleation sites for the electrically conductive material are provided not only on the surface area to be contacted but also on the sidewall of the opening so that the electrically conductive material may be deposited on and thus 'grow' from the sidewall as well as the surface area. Such sidewall growth of the electrically conductive material may result in voids or spaces in the electrically conductive region or plug which may detrimentally affect the quality of the electrical contact to the underlying region.

SUMMARY OF THE INVENTION

It is an aim of the present invention to provide a method of manufacturing a semiconductor device which enables an activating layer to be provided only on the surface area to be electrically contacted and which is not dependent on the nature of the exposed surface area.

According to the present invention, there is provided a method of manufacturing a semiconductor device, which method comprises providing a semiconductor body having at a major surface a surface structure comprising an insulating layer through which is formed an opening defining a sidewall of insulating material bounding an exposed surface area of a region beneath the insulating layer, providing an activating layer on the exposed surface area and the sidewall of the opening, and depositing electrically conductive material on the activating layer to form an electrically conductive region in the opening in electrical contact with the underlying region, characterized by providing the activating layer so that the activating layer material on the sidewall has different characteriztics from the activating layer material on the exposed surface area and selectively etching the activating layer to remove the activating layer material from the sidewall of the opening before depositing the electrically conductive material.

Thus, in a method in accordance with the invention, the activating layer is provided in such a manner that the portion of the activating layer on the sidewall of the opening can be selectively etched with respect to the portion on the surface area of the underlying region so enabling the sidewall portion of the activating layer to be removed.

Accordingly, only the activating layer portion on the surface area of the underlying region remains so that deposition of the electrical material occurs on the activating layer to cause 'growth' of the electrically conductive upwards from the surface area. Little or no deposition of the electrically conductive material occurs on the opening sidewall so inhibiting sideways growth of the electrically conductive material and thus avoiding or at least reducing the possibility of voids being formed in the electrically conductive region.

In addition such a method is not reliant on the properties of the surface area to be contacted. In particular, the present method does not rely on the surface area to enable selective deposition of the activating layer onto only the surface area. Rather, the activating layer is provided on the surface area and the sidewall of the opening and then selectively removed from the sidewall. This enables the surface area to be, for example, a metal, a silicide or a silicon surface area and, especially in the case of contact areas or contact holes for enabling electrical contact to semiconductor device regions, allows formation of the electrically conductive region even where the opening extends (due, for example, to misalignment) onto an insulating region adjacent the region to be contacted.

The activating layer may be provided on the exposed surface area and the sidewall of the opening by depositing the activating layer over the insulating layer and then removing the activating layer from the top surface of the insulating layer. The portion of the activating layer on the top surface of the insulating layer may be removed by polishing which avoids the need for a photosensitive resist or other mask layer. This provides a simple way of removing the top surface portion of the activating layer without the need for resist or other masks. Of course, a mask, for example a photosensitive resist mask, could be used to enable removal of the top surface portion of the activating layer.

In a preferred method, the activating layer is of titanium-tungsten alloy provided by sputtering. The present inventor has found that when a titanium-tungsten alloy is deposited by sputtering, the composition of the alloy on the surface area which is generally transverse to the direction of sputtering differs from the composition of the alloy on the sidewall which lies generally in the direction of sputtering and, in particular, that the portion of the titanium-tungsten alloy on the opening sidewall is comparatively rich in titanium.

It is believed that this difference in composition arises because of the different masses of the titanium and tungsten atoms. Thus, the relatively light titanium atoms are far more susceptible to scattering by collision with gas atoms in the sputtering plasma than are the relatively heavy tungsten atoms. Accordingly, the tungsten atoms will tend to be sputtered directly towards the substrate whereas the titanium atoms will be scattered. Accordingly the alloy deposited on surfaces which are transverse to the sputtering direction will be rich in tungsten while the alloy deposited on surfaces which lie generally in the direction of sputtering will be rich in titanium.

The fact that the composition of the alloy on the sidewall is different from that of the alloy on the surface area results in the alloy on the sidewall having different characteristics from the alloy on the surface area enabling the alloy on the surface area to be etched selectively. The titanium-rich portion may be removed by using hot phosphoric acid or possibly dilute hydrofluoric acid.

The use of a method in accordance with the invention enables the use of aluminum and the attendant problems of electromigration can be avoided because the electrically conductive material may be deposited by an electroless deposition technique and may be for example gold, copper or nickel. As a further alternative, electrically conductive material may be deposited onto the activating layer using a selective chemical vapor deposition technique. Thus, for example, tungsten may be selectively deposited onto the activating layer. The activating layer may also serve to provide a barrier to contamination of the exposed surface area by the subsequent metallization. This may be especially important where the metallization contains copper.

BRIEF DESCRIPTION OF THE DRAWING

Embodiments of the invention will now be described by way of example with reference to the accompanying drawing, in which.

Figure 1:
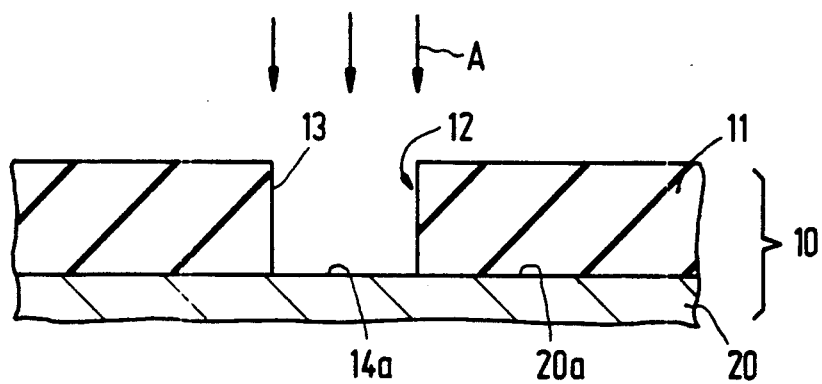
FIGS. 1 to 5 are cross-sectional views of part of a semiconductor body for illustrating a method in accordance with the invention.

It should of course be understood that the Figures are merely schematic and are not to scale. In particular, certain dimensions, especially the thickness of layers may have been relatively exaggerated in the interests of clarity.

The same or similar reference numerals are used throughout the Figures to illustrate the same or similar parts.

DESCRIPTION OF THE PREFERRED EMBODIMENTS

Referring now to the drawings, in particular FIGS. 1 to 5, there is illustrated a method of manufacturing a semiconductor device 100 (FIG. 6) which method comprises providing a semiconductor body 1 (FIG. 6) having at a major surface 2 a surface structure 10 comprising an insulating layer 11 through which is formed an opening 12 defining a sidewall 13 of insulating material bounding an exposed surface area 14a of a region 14 (FIG. 6) beneath the insulating layer 11, providing an activating layer 15 on the exposed surface area 14a and the sidewall 13 of the opening 12, and depositing electrically conductive material on the activating layer 15 to form an electrically conductive region 16 in the opening 12 and in electrical contact with the underlying region 14.

In accordance with the invention, the method further comprises providing the activating layer 15 so that the activating layer material 15a on the sidewall 13 has different characteristics from the activating layer material 15b on the exposed surface area 14a and selectively etching the activating layer to remove the activating layer material 15a from the sidewall 13 of the opening 12 before depositing the electrically conductive material. The activating layer 15 is thus provided in such a manner that the portion 15a of the activating layer on the sidewall 13 of the opening 12 can be selectively etched with respect to the portion 15b on the surface area 14a of the underlying region so enabling the sidewall portion 15b of the activating layer to be removed.

Accordingly, only the activating layer portion 15b on the surface area 14a of the underlying region remains so that deposition of the electrical material occurs on the activating layer portion 15b to cause 'growth' of the electrically conductive upwards from the surface area. Little or no deposition of the electrically conductive material occurs on the opening sidewall 13, so inhibiting side ways growth of the electrically conductive material and thus avoiding or at least reducing the possibility of voids being formed in the electrically conductive region.

Also this method is not reliant on the properties of the surface area 14a to be contacted. In particular, the method does not rely on the characteristics of the surface area 14a to enable selective deposition of the activating layer 15 onto only the surface area 14a. Rather, the activating layer 15 is provided on the surface area 14a and the sidewall 13 of the opening 12 and then selectively removed from the sidewall 13. This enables the surface area 14a to be, for example, a metal, a silicide or a silicon surface area and moreover allows, especially in the case of contact areas or contact holes to semiconductor device regions, formation of the electrically conductive region even where the opening extends (due, for example, to misalignment) onto insulating regions adjacent the region to be contacted.

Referring now more specifically to the drawings, FIG. 1 illustrates a surface structure 10 of a semiconductor body. The surface structure 10 comprises the insulating layer 11 which may be, for example, a silicon oxide layer deposited by chemical vapor deposition a TEOS (tetraethylorthosilicate) layer or any other suitable insulating material such as a silicon nitride layer and is provided on a surface 20a of the remaining portion 20 of the surface structure 10. As will be described in more detail below with reference to FIGS. 6 and 7 the remaining portion 20 of the surface structure 10 may comprise a surface region of the semiconductor body 1 (FIG. 6) at which is provided a doped region 14 to be electrically contacted or may comprise a region 140 of a metallization level provided on the semiconductor body 1 (FIG. 7). The nature of the region 14 to be electrically contacted is not important and accordingly this region is not specifically shown in FIGS. 1 to 5 but is indicated merely by its surface area 14a.

The opening 12 is formed in the insulating layer 11 using conventional photolithographic and etching techniques to expose the surface area 14a.

Figure 2:
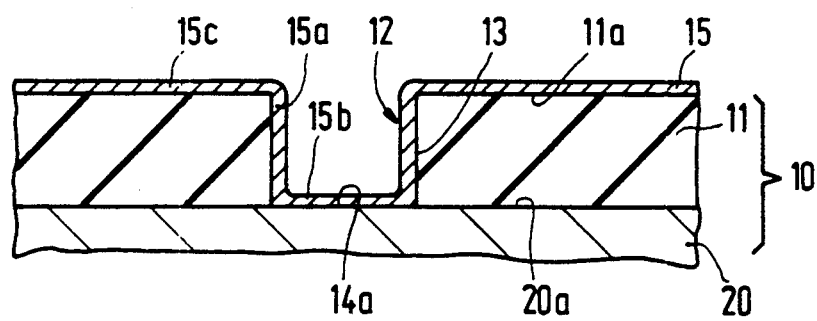

The semiconductor body carrying the surface structure 10 is then placed in a conventional sputtering machine, for example a sputter machine produced by Oke of Japan and material is sputtered onto the surface structure 10 as indicated by the arrows A in FIG. 1 to produce the activating layer 15 shown in FIG. 2. In this example, the activating layer 15 is formed of a titanium-tungsten alloy by sputtering material from a target formed of a titanium-tungsten alloy. As shown in FIG. 2 the activating layer 15 is at this state a blanket layer covering the top surface 11a of the insulating layer 11, the sidewall 13 and the surface area 14a.

A chemomechanical polishing process is then used to remove the portion 15c of the activating layer 15 present on the top surface 11a of the insulating layer 11. The polishing may be carried out using an abrasive slurry such as an alumina slurry in a commercial polishing machine as described in, for example, EP-A-223920. The polishing may be continued for a given time which may be determined experimentally. However, a polishing stop layer, such as a layer of silicon nitride (see EP-A-223902) may be provided on top of the insulating layer 11 to provide better control of the end point of the polishing. The insulating layer 11 itself may be formed of silicon nitride which should assist in preventing diffusion of, for example, copper atoms and thus should assist in inhibiting contamination of the semiconductor body where copper is used for the metallization. After the polishing step has been completed so as to remove the portion 15c of the activating layer 15 on the top surface 11a of the insulating layer 11, the structure shown in FIG. 3 is obtained.

Figure 3:
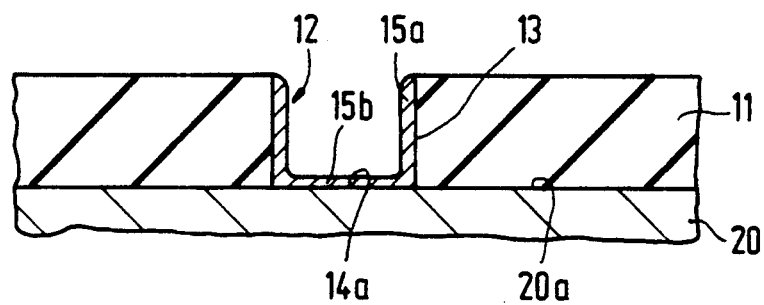
Figure 4:
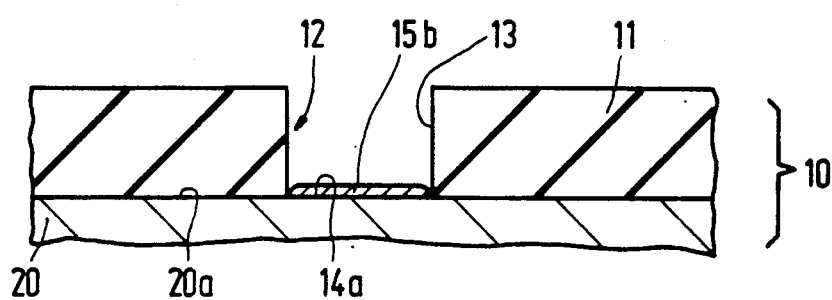
Figure 5:
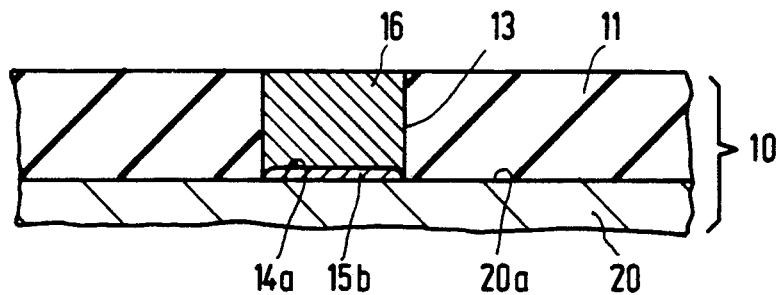

As illustrated in FIG. 3, the activating layer 15 remains on the sidewall 13 of the opening 12 as well as on the surface area 14a after completion of the polishing step.

As will be appreciated by those skilled in the art, the activating layer 15 provides a surface to which the subsequently deposited electrically conductive material adheres preferentially. Thus, the activating layer 15 may provide nucleation sites for the growth of the electrically conductive material. If the portion 15a of the activating layer 15 remains on the sidewall 13 of the opening 12, then 'growth' or deposition of the electrically conductive material will occur on both the sidewall portion 15a and the surface area portion 15b of the activating layer 15. Especially where the opening 12 is relatively narrow, as is particularly the case for very large scale integrated (VLSI) circuits, the electrically conductive material deposited on the sidewall 13 of the opening may meet or join together preventing further deposition at the surface area 14a and thus resulting in voids or spaces in the electrically conductive material. Such voids or spaces may detrimentally affect the quality of the electrical contact to the underlying region 14.

In order to avoid or at least reduce such problems, the portion 15a of the activating layer 15 on the sidewall 13 should be removed.

The present inventor has found that, when a titanium-tungsten alloy is deposited by sputtering, the composition of the portion 15b of the titanium-tungsten alloy on the surface area 14a which is generally transverse, as shown perpendicular, to the direction of sputtering differs from the composition of the titanium-tungsten portion 15a of the alloy on the sidewall 13 of the opening 12 which lies generally in the direction A of sputtering and, in particular, that the portion 15a of the titanium-tungsten alloy on the opening sidewall 13 is comparatively rich in titanium.

It is believed that this difference in composition arises because of the different masses of the titanium and tungsten atoms. Thus, the relatively light titanium atoms are far more susceptible to scattering by collision with gas atoms in the sputtering plasma than are the relatively heavy tungsten atoms. Accordingly, the tungsten atoms will tend to be sputtered directly towards the substrate whereas the titanium atoms will be scattered. Thus, the alloy deposited on surfaces which are transverse to the sputtering direction will be rich in tungsten whilst the alloy deposited on surfaces which lie generally in the direction of sputtering will be rich in titanium.

The fact that the composition of the portion 15a of the alloy on the sidewall 13 is different from that of the portion 15b of the alloy on the surface area 14a results in the portion 15a having different characteristics from the portion 15b and enables the portion 15a to be etched selectively with respect to the portion 15b. The titanium rich portion 15a may be removed by using hot phosphoric acid or possibly dilute hydrofluoric acid to produce the structure shown in FIG. 4. Thus, using relatively simple selective etching techniques, only the activating layer portion 15b on the surface area 14a remains so that the subsequently deposited electrically conductive material which adheres or deposits preferentially on the activating layer portion 15b is deposited at the surface area 14a and 'grows' upwards to fill the opening 12. As there is little or no preferential deposition on the sidewall 13 of the opening 12, the possibility of voids or spaces being formed in the electrically conductive material is reduced.

In addition, using the selective etching process in accordance with the invention enables the sidewall portion 15a of the activating layer 15 to be removed without the need for the use of mask. Also because the selective etching is determined by the different compositions of the alloy material deposited on the side wall 13 and the surface area 14a, the end point of the etching process is self-determining and relatively precise, so avoiding or at least reducing the possible problems of under or over etching of the activating layer 15.

Electrically conductive material is then deposited by, in this example, a conventional electroless deposition technique to form the electrically conductive region 16. The presence of the activating layer 15b only on the surface area 14a enables a selective deposition technique to be used for forming the electrically conductive region. This enables electrically conductive materials, such as copper, which cannot easily be etched by the normally available methods such as plasma etching, to be used. Accordingly, the use of aluminum and the attendant problems of electromigration can be avoided.

The selective deposition technique may be an electroless plating technique. The electrically conductive material may be for example copper, in which case an electroless plating solution of the type described in the paper entitled 'Copper as the future interconnection material' by P. L. Pai and C. H. Ting at page 258 et. seq. of the proceedings of the VMIC Conference in 1989 at Santa Clara, USA may be used.

Other materials, for example gold or nickel, may be deposited in place of copper using a similar electroless deposition technique. An example of an electroless nickel deposition solution is given in a paper by C. H.

Ting and M. Paunovic entitled 'Selective Electroless Metal Deposition for integrated circuit fabrication' published in the Journal of the Electrochemical Society (J. Electrochem. Soc.) in Volume 136 No. 2 Feb. 1989 at pages 456 to 461. The use of copper is, however, preferred because of its low resistivity. Generally, the electroless plating solution is an aqueous solution of an organic salt, nitrate or sulphate of the metal and in order to achieve precipitation of the metal from the solution onto the activating layer portion 15b, the alloy forming the metal to be deposited should have an ionization potential smaller than that of the activating layer material.

As a further alternative, electrically conductive material may be deposited onto the activating layer 15 using a selective chemical vapor deposition technique. Thus, for example, tungsten may be selectively deposited onto the titanium-tungsten activating layer 15.

In addition to providing nucleation sites for the electrically conductive material, the activating layer portion 15b also serves as a barrier layer between the region 14 and the electrically conductive material region 16 to prevent or at least inhibit contamination of the region 14 by the electrically conductive material which is especially important where the electrically conductive material is or comprises copper.

The method described above may be used to provide contact to any suitable region of a semiconductor device. Thus, the region may be, for example, a semiconductor device region, such as a source or drain region, or part of a lower metallization level.

Figure 6:
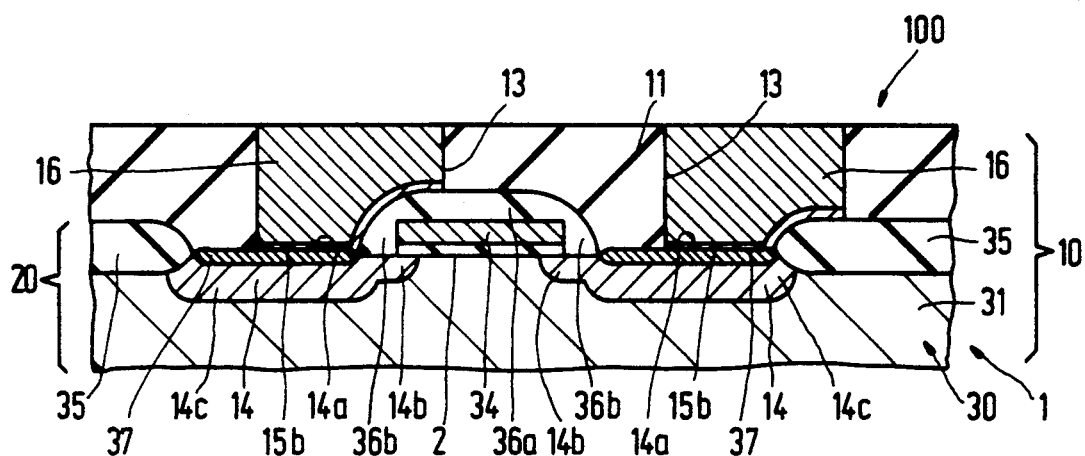
FIG. 6 is a cross-sectional view of part of a semiconductor device in which a contact hole has been filled by a method in accordance with the invention.
Figure 7:
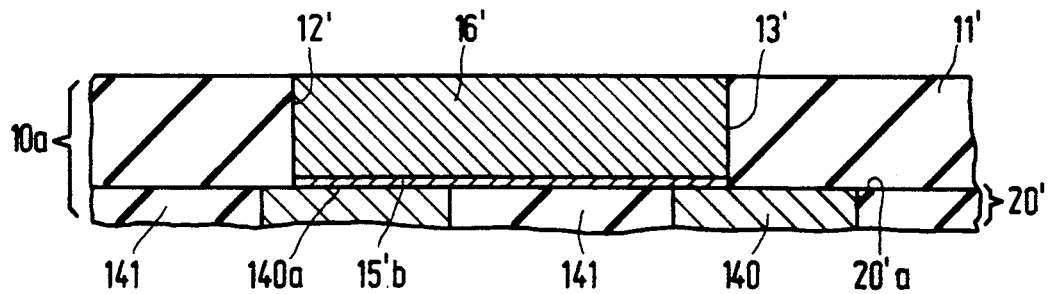
FIG. 7 is a cross-sectional view of part of another semiconductor device in which an interconnection between metallization levels has been formed by a method in accordance with the invention.

FIG. 6 illustrates part of a semiconductor device 1 in which a method in accordance with the invention has been used to make electrical connection to a semiconductor device region by enabling deposition of electrically conductive material into a contact hole.

In the example shown in FIG. 6, the semiconductor device comprises a monocrystalline silicon semiconductor body 30 having adjacent one major surface 2 a doped region 31 of one conductivity type, in this example p-conductivity type, within which more highly doped device regions 14 of the opposite conductivity type, in this example n-conductivity type, are provided adjacent the one major surface 2. Although only two device regions 14 are shown in FIG. 6, it will be appreciated that the semiconductor body 1 will have many such device regions provided therein. In this example, the device regions 14 are associated with insulated gate structures 34 (only one being shown) provided on the one major surface 2 to form insulated gate field effect transistors (IGFETs). The device regions 14 mentioned above, being of n-conductivity type, form n-channel IGFETs. However, as will be appreciated by those skilled in the art, the semiconductor body may also contain p-channel IGFETs, so as to form a CMOS integrated circuit, with the p-channel IGFETs being formed by p-conductivity type device regions provided within an n-conductivity type well and, of course, associated insulated gates.

The devices described above are formed in the semiconductor body 1 by, after definition of a field oxide pattern (part of an insulating region 35 of which is shown in FIG. 6) by conventional local oxidation of silicon (LOCOS) techniques, forming the insulated gate structure 34 in conventional manner by growing a gate oxide layer on the surface 2 and then providing a doped polycrystalline silicon layer on the gate oxide layer. The doped polycrystalline silicon layer is locally capped by an insulating region 36a of, for example, silicon oxide and/or silicon nitride. After patterning by conventional photolithographic and etching techniques lowly doped extension regions 14b of the device regions 14 are formed in self-aligned manner using the insulated gate structure 34 and the field oxide pattern 35 as a mask.

A silicon oxide or silicon nitride layer is then deposited by a conventional chemical vapor deposition technique and etched using a suitable known anisotropic etching process to provide, as shown in FIG. 6, insulating spacer regions 36b on the sidewalls of the insulated gate 34 which, together with the insulating capping region 36b, encapsulate the insulated gate 34 to avoid undesired shorting by subsequent metallization between the insulated gate 34 and a device region 14. Although not shown, other insulated gates of the device need not necessarily all be provided with a capping region 36a.

More highly doped regions 14c of the device regions 14 are formed in conventional self-aligned manner using the insulated gate 34, spacer regions 36b and field oxide insulating regions 35 as a mask.

In order to improve ohmic contact to the device regions 14, silicide regions 37, for example titanium or cobalt silicide, are formed at the surfaces of the device regions 14 in known manner by, for example, depositing a layer of titanium or cobalt and heating. This completes the portion 20 of the surface structure in this example.

The insulating layer 11 is then provided as a layer of, in this example, silicon dioxide deposited by conventional CVD techniques. The surface structure 10 is thus completed.

After the openings or contact holes 12 (two only are shown in FIG. 6) have been formed in conventional manner, the method described above with reference to FIGS. 1 to 5 is used to provide the electrically conductive regions 16 (two are shown) contacting respective device regions 14. Subsequent metallization levels (not shown in FIG. 6) may be provided in conventional manner.

FIG. 7 illustrates a situation where the portion 20' of the surface structure 10a comprises a metallization level and the underlying region 140 forms part of that metallization level. In the example shown in FIG. 7 two regions 140 forming part of the metallization level are shown. The regions 140 may be electrically conductive regions similar to the regions 16 shown in FIG. 5 contacting semiconductor device regions 14 or may be part of a subsequent metallization level. The regions 140 of the metallization level are bounded by insulating material 14 and together with a covering insulating layer 11' form the surface structure 10a. The insulating 11' may be, for example, a silicon dioxide layer deposited by, for example, a chemical vapor deposition (CVD) technique or a TEOS layer or a silicon nitride layer. Where the regions 140 directly contact semiconductor device regions then the underlying structure of the semiconductor device may be similar to that shown in FIG. 6 although it will be appreciated that the present invention can be applied to semiconductor devices other than CMOS devices, for example bipolar or BiCMOS devices.

An opening 12' bounded by a sidewall 13' is formed by conventional means in the insulating layer 11' and an activating layer portion 15'b and electrically conductive region 16' are formed in the manner described above with reference to FIGS. 1 to 5 to provide an electrical interconnection 16' between the regions 140. As will be appreciated, in this example, the activating layer portion 15'b need not make contact everywhere with the portion 20' and could, for example, extend up over the insulating layer 11 between the regions 140. The above described process may be repeated for further metallization levels.

The use of the activating layer portion 15b, 15'b to provide a nucleation layer for the electrically conductive material region 16,16' means that the selective deposition of the electrically conductive material is not dependent on the nature of the surface area 14a,140a and, accordingly, as illustrated in FIGS. 6 and 7, the opening 12,12' may, overlap onto an adjacent insulating region without significantly affecting the subsequent deposition of the electrically conductive material to form the electrically conductive region or plug 16,16'. The method is thus relatively tolerant of misalignment problems and facilitates the relatively close packing of active devices within the semiconductor device which is required for example VLSI devices.

Although in the examples described above, the activating layer 15 is formed of titanium-tungsten deposited by a sputtering technique, the activating layer 15 may be formed of other suitable alloys and using any suitable deposition techniques in which one component of the alloy is lighter and thus more easily scattered by gas or other atoms present in the deposition chamber than another component of the alloy so that the composition of the deposited material varies depending on whether the surface on which the material is deposited is in the direction of or transverse to the direction of supply of the material to be deposited. The material deposited on the sidewall which will be relatively rich in the one component should, of course, be capable of being selectively etched with respect to the material on the exposed surface area 14a which will be rich in the other component. Of course, the alloy may comprise additional components.

Although the above description refers to silicon semiconductor devices, it will of course be appreciated that a method in accordance with the invention may be applied to other semiconductor devices for example III-V semiconductor devices such as gallium arsenide semiconductor devices.

From reading the present disclosure, other modifications and variations will be apparent to persons skilled in the art. Such modifications and variations may involve other features which are already known in the semiconductor art and which may be used instead of or in addition to features already described herein.

I claim:

1. A method of manufacturing a semiconductor device, which method comprises providing a semiconductor body having at a major surface a surface structure comprising an insulating layer through which is formed an opening defining a sidewall of insulating material bounding an exposed surface area of a region beneath the insulating layer, providing an activating layer on the exposed surface area and the sidewall of the opening, and depositing electrically conductive material on the activating layer to form an electrically conductive region in the opening in electrical contact with the underlying region, characterized by providing the activating layer so that the activating layer material on the side wall has a different composition from that of the activating layer material on the exposed surface area and selectively etching the activating layer to remove the activating layer material from the sidewall of the opening before depositing the electrically conductive material.

2. A method according to claim 1, further characterized by providing the activating layer on the exposed surface area and the sidewall of the opening by depositing the activating layer over the insulating layer and selectively removing the activating layer from the top surface of the insulating layer.

3. A method according to claim 2, further characterized by removing the activating layer from the top surface by polishing.

4. A method according to claim 1, further characterized by providing the activating layer by sputtering.

5. A method according to claim 1, further characterized by providing the activating layer as a layer of a titanium-tungsten alloy.

6. A method according to claim 5, further characterized by using hot phosphoric acid to selectively remove the activating layer from the sidewall of the opening.

7. A method according to claim 1, further characterized by using an electroless deposition technique to deposit the electrically conductive material.

8. A method according to claim 1, further characterized by depositing a material selected from the group consisting of copper, gold and nickel as the electrically conductive material.

9. A method according to claim 1, further characterized by selectively depositing tungsten as the electrically conductive material.

* * * * *